United States Patent [19]

Mori

[11] Patent Number: 4,646,429
[45] Date of Patent: Mar. 3, 1987

[54] METHOD OF MAKING MAGNETIC HEAD

[75] Inventor: Keiji Mori, Kanagawa, Japan

[73] Assignee: Fuji Photo Film Co., Ltd., Kanagawa, Japan

[21] Appl. No.: 543,202

[22] Filed: Oct. 19, 1983

[30] Foreign Application Priority Data

Oct. 20, 1982 [JP]  Japan ............................ 57-184300

[51] Int. Cl.$^4$ ............................................. C23C 14/34
[52] U.S. Cl. .................................. 29/603; 204/192.2; 204/192.22
[58] Field of Search ........ 204/192 C, 192 SP, 192 M, 204/192 D, 192 R, 298; 29/603; 118/720; 427/282, 128

[56] References Cited

U.S. PATENT DOCUMENTS

| | | | |
|---|---|---|---|
| 3,117,885 | 1/1964 | Pohm et al. | 118/720 X |
| 3,751,803 | 8/1973 | Fisher et al. | 29/603 |
| 4,303,489 | 12/1981 | Morrison, Jr. | 204/192 R |
| 4,436,593 | 3/1984 | Osborne et al. | 204/15 |

FOREIGN PATENT DOCUMENTS 57-40723  3/1982  Japan .

Primary Examiner—John F. Niebling
Assistant Examiner—William T. Leader
Attorney, Agent, or Firm—Sughrue, Mion, Zinn, Macpeak & Seas

[57] ABSTRACT

A main magnetic pole of a magnetic head for perpendicular magnetization is made in a sputtering apparatus by continuously moving a shielding plate closely to a substrate in a space between the substrate and a target electrode standing face to face with each other, whereby the thickness of a soft-magnetic metal film formed on the substrate by sputtering is continuously changed.

5 Claims, 9 Drawing Figures

METHOD OF MAKING MAGNETIC HEAD

BACKGROUND OF THE INVENTION

1. Field of the Invention

This invention relates to a method of making a magnetic head for perpendicular magnetization recording and reproducing, which conducts high-density recording and reproducing.

2. Description of the Prior Art

As a system for recording information in a magnetic recording medium, for example, a magnetic tape or magnetic disk, and reproducing the information therefrom, there has heretofore been widely used a system wherein the magnetic layer of the magnetic recording medium is magnetized horizontally with respect to the surface of the magnetic layer.

The magnetic head used in the aforesaid recording and reproducing system is generally called a ring type head. The ring type head exhibits a high reproducing efficiency. However, since there is a large reduction in the magnetic field intensity generated in the recording bit, it is not always possible for the ring type head to achieve high-density recording.

Recently, it has been proposed to employ a perpendicular magnetization recording and reproducing system capable of conducting high-density recording, instead of the intra-surface recording and reproducing system using the aforesaid ring type head, i.e. the horizontal magnetization recording and reproducing system. In the perpendicular magnetization recording and reproducing system, the magnetic layer of the magnetic recording medium is magnetized perpendicularly to the surface of the magnetic layer. This system is being proved to be basically very excellent.

In the aforesaid perpendicular magnetization recording and reproducing system, in order to satisfactorily conduct perpendicular magnetization recording, it is first necessary to use a magnetic recording medium exhibiting magnetic anisotropy perpendicular to the recording surface. Further, it is essential to use a magnetic head capable of generating the magnetic field component perpendicular to the recording surface in a sharp distribution pattern.

As the magnetic recording medium for the perpendicular magnetization recording, it is known that a sputtered Co-Cr film or a deposited Co-Cr film is suitable.

FIG. 1 is a sectional view showing the relationship between a recording medium and an ordinary auxiliary magnetic pole excitation type head for perpendicular magnetization recording. As the magnetic head for the perpendicular magnetization recording described above, the auxiliary magnetic pole excitation type head as shown in FIG. 1 is widely used. This magnetic head comprises a flat plate-like main magnetic pole 2 positioned on the magnetic layer side of a magnetic recording medium 1, and an auxiliary magnetic pole 3 provided with an exciting coil 4 therearound and positioned on the side opposite to the magnetic layer.

The magnetic head as described above is excellent in that it generates a magnetic field exhibiting a sharp distribution pattern in the direction perpendicular to the recording surface. However, when the recording bit is narrower than the thickness (t) of the main magnetic pole 2, the magnetic pole 2 extends over the recording bits magnetized in the directions reverse to each other as indicated by the arrows. Therefore, in the reproducing step, the magnetic flux is circulated without crossing the coil 4. As a result, the reproducing output is markedly decreased. When the thickness (t) (in general, within the range of 3 μm to 1 μm) of the main magnetic pole 2 is double the bit length, the reproducing output disappears.

FIG. 2 is a graph showing the recording density characteristics of the magnetic head of FIG. 1, i.e. the relationship between the reproducing output and the bit density in the system of FIG. 1. In the output change pattern shown in FIG. 2, the point a indicates the case wherein the bit length is half the thickness (t) of the main magnetic pole 2, and the point b indicates the case wherein the bit length is a quarter of the thickness (t) of the main magnetic pole 2.

In order to eliminate the drawback of the conventional perpendicular magnetization recording and reproducing head, it has been proposed in Japanese Unexamined Patent Publication No. 57(1982)-40723 to use a magnetic head wherein the thickness of the main magnetic pole is continuously changed in the width direction of the track, thereby to prevent the reproducing output from decreasing sharply.

However, the magnetic head disclosed in aforesaid Japanese Unexamined Patent Publication No. 57(1982)-40723 is made by a method wherein a thin film having a uniform thickness and made of a soft-magnetic metal such as permalloy, Sendust or an amorphous magnetic material formed on a substrate by sputtering or the like is abraded so as to continuously change the film thickness in one direction. Therefore, it is not always possible to accurately obtain desired film thicknesses for reasons of processing accuracy, and the electromagnetic transducing characteristics of the magnetic head are not always satisfactory.

SUMMARY OF THE INVENTION

The primary object of the present invention is to provide a method of making a magnetic head for perpendicular magnetization recording and reproducing, wherein the magnetic head is finished to an accurate shape.

Another object of the present invention is to provide a method of making a magnetic head for perpendicular magnetization recording and reproducing, which exhibits markedly improved recording density characteristics, particularly excellent characteristics in the high-density region.

The above objects are accomplished by a method of making a magnetic head comprising the step of, in a sputtering apparatus, continuously moving a shielding plate closely to a substrate in a space between said substrate and a target electrode standing face to face with each other, whereby the thickness of a sputtered soft-magnetic metal film on said substrate is continuously changed to form a main magnetic pole of a magnetic head for perpendicular magnetization.

In the present invention, the thickness of the sputtered soft-magnetic metal film for use as a main magnetic pole can be continuously changed by the continuous movement of the shielding plate, and the processing finish accuracy of the film can be improved markedly. As a result, the magnetic head made in accordance with the present invention exhibits markedly improved recording density characteristics, particularly excellent characteristics in the high-density region.

DESCRIPTION OF THE PREFERRED EMBODIMENTS

The present invention will hereinbelow be described in further detail with reference to the accompanying drawings.

Figure 1:
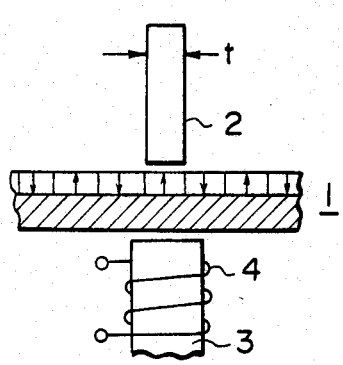
FIG. 1 is a sectional view showing the relationship between a recording medium and an ordinary auxiliary magnetic pole excitation type head for perpendicular magnetization recording.
Figure 2:
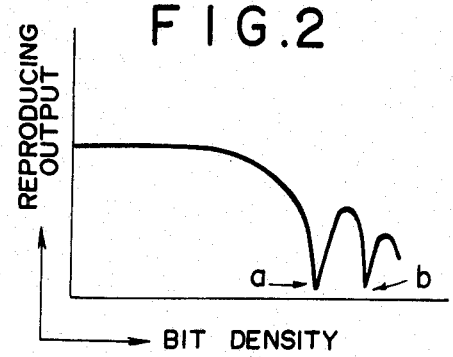
FIG. 2 is a graph showing the recording density characteristics of the magnetic head of FIG. 1.
Figure 3:
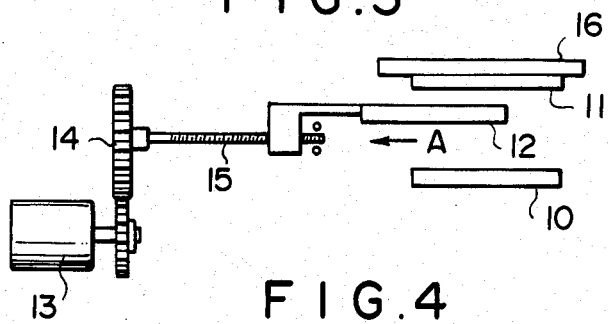
FIG. 3 is a schematic view showing a sputtering apparatus for carrying out the method of making a magnetic head in accordance with the present invention.

FIG. 3 schematically shows the main sections of a main magnetic pole forming apparatus for carrying out the method of making a magnetic head in accordance with the present invention.

The main sections shown in FIG. 3 are positioned in an RF sputtering apparatus. A target electrode 10 made of a soft-magnetic metal such as permalloy is positioned in face-to-face relation to a substrate 11 made of barium titanate or the like. In this apparatus, a sputtering power of about 500W is applied under argon gas at about $5 \times 10^{-3}$ Torr.

In the space between the substrate 11 and the target electrode 10, a shielding plate 12 is moved along and closely to the substrate 11. The shielding plate 12 is horizontally moved by a motor 13 (for example, a stepping motor) via a reduction gear 14 and a screw shaft 15.

The reference numeral 16 designate an anode electrode capable of holding the substrate 11.

Figure 4:
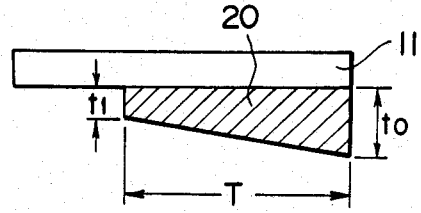
FIGS. 4 to 7 are schematic views showing the manufacturing processes of an embodiment of the method in accordance with the present invention.

In the RF sputtering apparatus described above, when sputtering is started and, at the same time, the motor 13 is driven to gradually move the shielding plate 12 in the direction of the arrow A, there is obtained a sputtered film 20 the thickness of which is continuously changed as shown in FIG. 4.

To determine the moving speed of the shielding plate 12, the shielding plate 12 is first removed from the space between the substrate 11 and the target electrode 10, and the normal sputtering rate is measured in this condition. Then, the necessary moving speed of the shielding plate 12 is calculated from the normal sputtering rate thus measured and a desired thickness gradient of a film 20 to be formed.

For example, when the normal sputtering rate is 0.2 μm/min., the necessary film thickness (t0) at one end of the substrate 11 is 1 μm, the necessary film thickness (t1) at the other end of the substrate 11 is 0.7 μm, and the distance between the ends of the substrate 11 is 10 μm, the moving speed of the shielding plate 12 is calculated as follows:

$$10\mu \div \left( \frac{1 \ \mu m}{0.2 \ \mu m/min.} - \frac{0.7 \ \mu m}{0.2 \ \mu m/min.} \right) = 10 \ \mu m/1.5 \ min.$$

Actually, the sputter film 20 formed as described above is made to have a slightly larger thickness and a slightly larger length than necessary, and then accurately finished to the desired dimensions by photo-etching.

Figure 5:
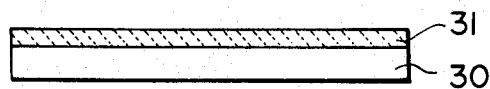
Figure 6:
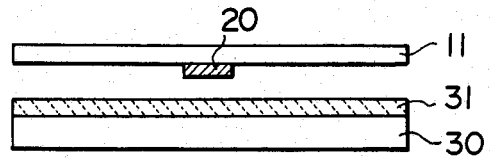
Figure 7:
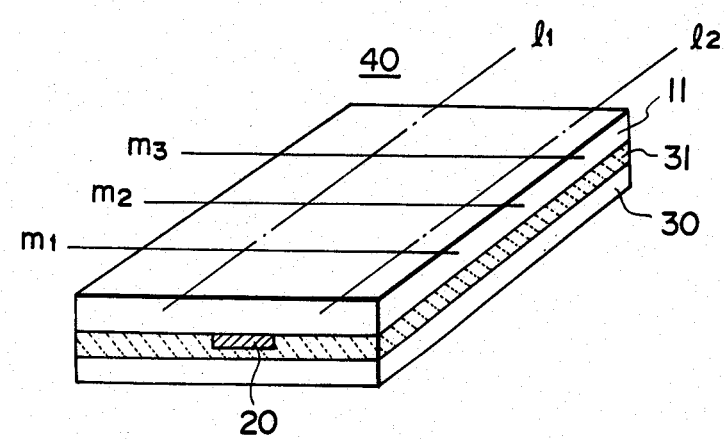

On the other hand, as shown in FIG. 5, a film 31 of a low-melting point glass is formed by sputtering on a substrate 30 made of barium titanate or the like. Then, as shown in FIG. 6, the glass film 31 is positioned in face-to-face relation to the sputtered film 20 previously formed on the substrate, and fused thereto in a vacuum furnace to form a stack 40 as shown in FIG. 7.

Thereafter, both end portions of the stack 40 are cut along lines l1 and l2. The stack 40 is further divided along lines m1, m2, m3, . . . to obtain sections for use as the main magnetic pole 2.

Figure 8:
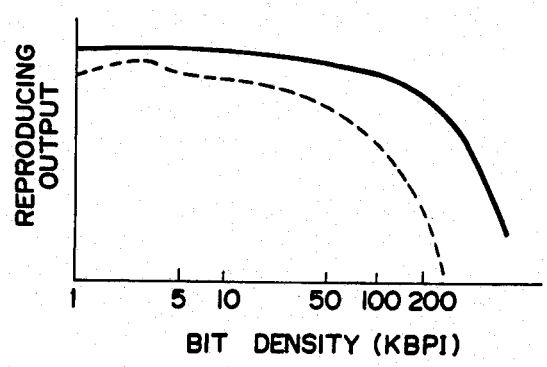
FIG. 8 is a graph showing the recording density characteristics of a magnetic head made by the method of the present invention (solid line) in comparison with those of a conventional magnetic head (broken line)

FIG. 8 is a graph showing the recording density characteristics of the magnetic head made by the method in accordance with the present invention (indicated by the solid line) and those of a conventional magnetic head made by abrasion (indicated by the broken line). As shown in FIG. 8, the magnetic head made by the method in accordance with the present invention exhibits markedly improved characteristics in the high-density region.

Figure 9:
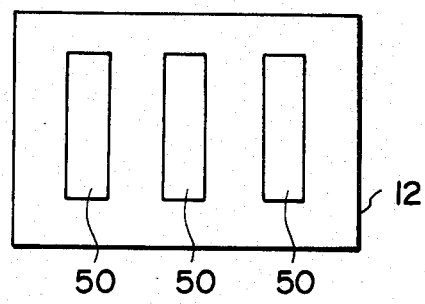
FIG. 9 is a schematic view showing a modified form of the shielding plate used in the method of the present invention.

FIG. 9 schematically shows a modified form of the shielding plate 12, wherein a plurality of rectangular openings 50 are perforated through the shielding plate 12. When the shielding plate 12 shown in FIG. 9 is used, it is possible to simultaneously form many main magnetic poles on the same substrate.

I claim:

1. A method of making a magnetic head in a sputtering apparatus comprising the steps of:
   sputtering a soft-magnetic metal film on a substrate spaced from and standing face to face to a target electrode and,
   simultaneously continuously moving a shielding plate closely to said substrate in a direction transverse to the substrate within the space between said substrate and said target electrode to progressively expose portions of said substrate as said sputtering occurs whereby said sputtered soft-magnetic metal film is formed with a thickness which changes continuously in the longitudinal direction across the substrate to make a magnetic pole of a magnetic head for perpendicular magnetization.

2. A method as defined in claim 1 further comprising the steps of fusing a low-melting point glass film sputtered on a second substrate to said sputtered soft-magnetic metal film formed on said first substrate, thereby to form a stack, and cutting said stack.

3. A method as defined in claim 1 wherein said shielding plate is provided with a plurality of rectangular openings perforated therethrough.

4. A method as defined in claim 1 wherein said step of continuously moving takes place at a speed that is a function of the different necessary film thicknesses at ends of said substrate divided by a normal sputtering rate.

5. A method as defined in claim 1 wherein the thickness of the sputtered metal film varies linearly from a maximum thickness t0 to a minimum thickness t1 as said shield moves across said substrate.

* * * * *